(12) United States Patent
Kim et al.

(10) Patent No.: US 9,548,426 B2
(45) Date of Patent: Jan. 17, 2017

(54) SEMICONDUCTOR LIGHT-EMITTING DEVICE

(71) Applicant: SAMSUNG ELECTRONICS CO., LTD., Suwon-si, Gyeonggi-do (KR)

(72) Inventors: Myeong Ha Kim, Hwaseong-si (KR); Chan Mook Lim, Seongnam-si (KR); Masaaki Sofue, Seongnam-si (KR); Sang Yeob Song, Suwon-si (KR); Mi Jeong Yun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/720,698

(22) Filed: May 22, 2015

(65) Prior Publication Data
US 2016/0087159 A1    Mar. 24, 2016

(30) Foreign Application Priority Data
Sep. 19, 2014    (KR) ........................ 10-2014-0125289

(51) Int. Cl.
*H01L 33/00* (2010.01)
*H01L 33/46* (2010.01)
*H01L 33/50* (2010.01)

(52) U.S. Cl.
CPC ............... *H01L 33/46* (2013.01); *H01L 33/50* (2013.01)

(58) Field of Classification Search
CPC ...................................... H01L 33/46
USPC ........................................... 257/98
See application file for complete search history.

(56) References Cited

U.S. PATENT DOCUMENTS

| | | | |
|---|---|---|---|
| 6,155,699 A | 12/2000 | Miller et al. | |
| 6,372,608 B1 | 4/2002 | Shimoda et al. | |
| 6,590,702 B1 * | 7/2003 | Shirai ................. | G02B 1/115 257/E21.029 |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,891,197 B2 | 5/2005 | Bhat et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |

(Continued)

FOREIGN PATENT DOCUMENTS

JP    2009-164423 A    7/2009
JP    2010-541209 A    12/2010

(Continued)

*Primary Examiner* — Matthew Landau
*Assistant Examiner* — Igwe U Anya
(74) *Attorney, Agent, or Firm* — Muir Patent Law, PLLC

(57) ABSTRACT

A semiconductor light-emitting device includes a light-emitting structure including a first conductivity-type semiconductor layer, an active layer, and a second conductivity-type semiconductor layer, and a selective transmission-reflection layer disposed on the light-emitting structure and including a plurality of dielectric layers having different optical thicknesses alternately stacked at least once. The sum of an optical thickness of a dielectric layer having a maximum optical thickness and an optical thickness of a dielectric layer having a minimum optical thickness is in the range of 0.75 to 0.80.

17 Claims, 18 Drawing Sheets

(56) References Cited

U.S. PATENT DOCUMENTS

| | | |
|---|---|---|
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,624,482 B2 | 1/2014 | Lin |
| 8,637,886 B2 | 1/2014 | Tsuji |
| 8,710,536 B2 | 4/2014 | Ibbetson et al. |
| 8,735,931 B2 | 5/2014 | Han et al. |
| 8,766,295 B2 | 7/2014 | Kim |
| 2006/0007548 A1* | 1/2006 | Watanabe ............... G02B 21/16 359/589 |
| 2008/0212631 A1* | 9/2008 | Takeuchi ............... B82Y 20/00 372/45.01 |
| 2008/0251794 A1 | 10/2008 | Koda et al. |
| 2009/0015758 A1* | 1/2009 | Pei .......................... G02B 5/045 349/69 |
| 2009/0127575 A1 | 5/2009 | Horng et al. |
| 2010/0278203 A1 | 11/2010 | Lell et al. |
| 2011/0114969 A1* | 5/2011 | Lee .......................... H01L 33/46 257/88 |
| 2011/0128343 A1* | 6/2011 | Sato ........................ B82Y 20/00 347/224 |
| 2011/0156073 A1 | 6/2011 | Park et al. |
| 2012/0161176 A1* | 6/2012 | Heo .......................... H01L 33/46 257/98 |
| 2012/0256221 A1* | 10/2012 | Ogawa .................. H01L 33/405 257/98 |
| 2013/0161675 A1 | 6/2013 | Lee et al. |
| 2015/0069434 A1* | 3/2015 | Lin ....................... G02B 5/0833 257/98 |

FOREIGN PATENT DOCUMENTS

| | | |
|---|---|---|
| JP | 4983346 B2 | 5/2012 |
| KR | 10-2009-0117002 A | 11/2009 |
| KR | 10-2010-0089833 A | 8/2010 |
| KR | 10-2012-0072711 A | 7/2012 |
| KR | 10-1181000 B1 | 9/2012 |
| KR | 10-2013-0074081 A | 7/2013 |
| KR | 10-2014-0028964 A | 3/2014 |

\* cited by examiner

SEMICONDUCTOR LIGHT-EMITTING DEVICE

CROSS-REFERENCE TO RELATED APPLICATION

This application claims priority under 35 U.S.C. §119 to Korean Patent Application No. 10-2014-0125289 filed on Sep. 19, 2014, with the Korean Intellectual Property Office, the disclosure of which is incorporated herein by reference.

BACKGROUND

The present disclosure relates to a semiconductor light-emitting device.

Semiconductor light emitting devices could generate light with various colors by electron-hole recombination. Since such semiconductor light emitting devices have advantages such as relatively long lifespans and low levels of power consumption, demand therefor is constantly increasing. When semiconductor light emitting devices are surface-emitting devices, the light-emitting areas thereof are limited to light exit surfaces. Accordingly, it is necessary to increase a luminous flux of light emitted through the light-emitting surfaces.

SUMMARY

An exemplary embodiment of the present inventive concept may provide a semiconductor light-emitting device capable of increasing luminous flux of light emitted through a light-emitting surface thereof.

According to an exemplary embodiment of the present inventive concept, a semiconductor light-emitting device may include a light-emitting structure including a first conductivity-type semiconductor layer, an active layer, and a second conductivity-type semiconductor layer, and a selective transmission-reflection layer disposed on the light-emitting structure and including a plurality of dielectric layers having different optical thicknesses alternately stacked at least once. A sum of an optical thickness of a dielectric layer having a maximum optical thickness and an optical thickness of a dielectric layer having a minimum optical thickness may be in the range of 0.75 to 0.80. The optical thickness may be defined by a formula, $(nd)/\lambda$, where n is a refractive index of a respective dielectric layer, d is a thickness of the respective dielectric layer, and $\lambda$ is a peak wavelength of light emitted by the light-emitting structure.

In some exemplary embodiments of the present inventive concept, the selective transmission-reflection layer may include a first dielectric layer and a second dielectric layer, and an optical thickness of the first dielectric layer may be greater than an optical thickness of the second dielectric layer.

In other exemplary embodiments of the present inventive concept, the optical thickness of the first dielectric layer may be in the range of 0.5 to 0.65, and the optical thickness of the second dielectric layer may be in the range of 0.1 to 0.35.

In other exemplary embodiments of the present inventive concept, the selective transmission-reflection layer may include a first dielectric layer, a second dielectric layer, and a third dielectric layer. An optical thickness of the first dielectric layer may be greater than an optical thickness of the second dielectric layer, and the optical thickness of the second dielectric layer may be greater than an optical thickness of the third dielectric layer.

In other exemplary embodiments of the present inventive concept, the optical thickness of the first optical thickness may be in the range of 0.5 to 0.65, and the optical thickness of the third dielectric layer may be in the range of 0.1 to 0.35.

In other exemplary embodiments of the present inventive concept, the first and third dielectric layers may not directly contact each other.

In other exemplary embodiments of the present inventive concept, a first electrode and a second electrode may be disposed below the light-emitting structure.

In other exemplary embodiments of the present inventive concept, a first electrode and a second electrode may be disposed on the light-emitting structure.

In other exemplary embodiments of the present inventive concept, a first electrode may be disposed below the light-emitting structure, and a second electrode may be disposed on the light-emitting structure.

In other exemplary embodiments of the present inventive concept, a reflective layer may be disposed below the light-emitting structure.

In other exemplary embodiments of the present inventive concept, the semiconductor light-emitting device may further include a transparent electrode layer in contact with the second conductivity-type semiconductor layer and the second electrode.

In other exemplary embodiments of the present inventive concept, the selective transmission-reflection layer may transmit blue-green light and reflect red light.

In other exemplary embodiments of the present inventive concept, the number of the plurality of dielectric layers may be 15 or more.

In other exemplary embodiments of the present inventive concept, the plurality of dielectric layers may be selected from the group consisting of $SiO_2$, $TiO_2$, $Ta_2O_3$, $MgF_2$, $CeO_2$, $Al_2O_3$, $ZrO_2$, MgO, $SnO_2$, ZnO, $B_2O_3$, $Li_2O$, SrO, $HfO_2$, and BaO.

In other exemplary embodiments of the present inventive concept, the semiconductor light-emitting device may further include a phosphor layer disposed on the selective transmission-reflection layer.

According to an exemplary embodiment of the present inventive concept, a semiconductor light-emitting device may include a light-emitting structure including a light-emitting structure including an n-type semiconductor layer, an active layer, and a p-type semiconductor layer, a selective transmission-reflection layer disposed on the light-emitting structure and including a first dielectric layer having an optical thickness in the range of 0.5 to 0.65 and a second dielectric layer having an optical thickness in the range of 0.1 to 0.35 alternately stacked at least once, and a phosphor layer disposed on the selective transmission-reflection layer. The optical thickness may be defined by a formula, $(nd)/\lambda$, where n is a refractive index of a respective dielectric layer, d is a thickness of the respective dielectric layer, and $\lambda$ is a peak wavelength of light emitted by the light-emitting structure.

According to an exemplary embodiment of the present inventive concept, a semiconductor light-emitting device may include a light-emitting structure including a first conductivity-type semiconductor layer, an active layer, and a second conductivity-type semiconductor layer; and a selective transmission-reflection layer formed on the light-emitting structure, and including a first group including a plurality of first dielectric layers each having a first optical thickness, a second group including a plurality of second dielectric layers each having a second optical thickness, and a third group including a plurality of third dielectric layers each having a third optical thickness. The first dielectric layers, the second dielectric layers, and the third dielectric layers may be sequentially stacked. The first optical thickness may be in the range of 0.5 to 0.65, the third optical thickness may be in the range of 0.1 to 0.35, and the second optical thickness may be less than the first optical thickness and greater than the third optical thickness. The optical thicknesses may be defined by a formula, (nd)/λ, where n is a refractive index of a respective dielectric layer, d is a thickness of the respective dielectric layer, and λ is a peak wavelength of light emitted by the light-emitting structure.

In other exemplary embodiments of the present inventive concept, the semiconductor light-emitting device may further include a phosphor layer. The selective transmission-reflection layer may be interposed between the phosphor layer and the light-emitting structure.

In other exemplary embodiments of the present inventive concept, the selective transmission-reflection layer may transmit blue-green light and reflect red light.

In other exemplary embodiments of the present inventive concept, a sum of the first optical thickness and the third optical thickness may be in the range of 0.75 to 0.8.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Figure 1:
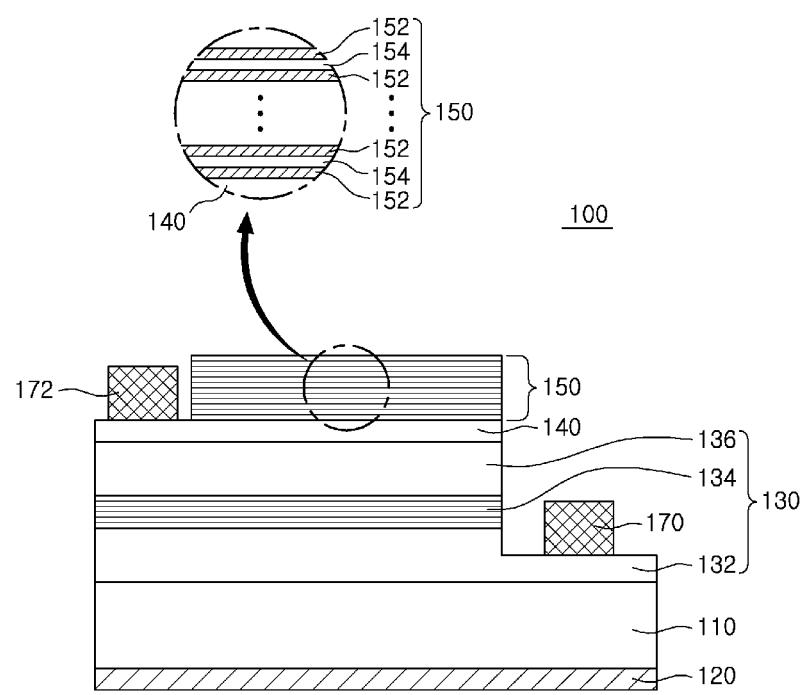
FIG. 1 is a cross-sectional view illustrating a semiconductor light-emitting device according to an exemplary embodiment of the present inventive concept and a selective transmission-reflection layer included therein.

Hereinafter, embodiments of the present inventive concept will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Reference throughout this disclosure to "one exemplary embodiment" or "an exemplary embodiment" is provided to emphasize a particular feature, structure, or characteristic, and do not necessarily refer to the same embodiment. Furthermore, the particular features, structures, or characteristics may be combined in any suitable manner in one or more embodiments. For example, a context described in a specific exemplary embodiment may be used in other embodiments, even if it is not described in the other embodiments, unless it is described contrary to or inconsistent with the context in the other embodiments.

Unless described otherwise, throughout this disclosure, terms such as "on," "upper surface," "below," "lower surface," "upward," "downward," "side surface," "high," and "low" may be relative terms based on the drawings, and may vary, depending on a direction in which a light-emitting device is disposed. Further, it will be understood that when a layer is referred to as being "on" or "below" another layer or a substrate, the layer may be formed directly on the other layer or the substrate, or an intervening layer may exist between the layer and the other layer or the substrate.

FIG. 1 is a cross-sectional view illustrating a horizontal semiconductor light-emitting device according to an exemplary embodiment of the present inventive concept, and a selective transmission-reflection layer included in the horizontal semiconductor light-emitting device.

Referring to FIG. 1, a semiconductor light-emitting device 100 may include a reflective layer 120, a light-transmissive growth substrate 110 disposed on the reflective layer 120, a first conductivity-type semiconductor layer 132 disposed on the light-transmissive growth substrate 110, an active layer 134 disposed on the first conductivity-type semiconductor layer 132, a second conductivity-type semiconductor layer 136 disposed on the active layer 134, a transparent electrode layer 140 disposed on the second conductivity-type semiconductor layer 136, a selective transmission-reflection layer 150 disposed on the transparent electrode layer 140, a second electrode 172 disposed on a partially exposed upper surface of the transparent electrode layer 140, and a first electrode 170 disposed on a partially exposed upper surface of the first conductivity-type semiconductor layer 132.

The light-transmissive growth substrate 110 may be a sapphire substrate. Sapphire is a crystal having Hexa-Rhombo R3c symmetry, has lattice constants of 13.001 Å in a c-axis orientation and 4.758 Å in an a-axis orientation, and has a C-plane (0001), an A-plane (1120), an R-plane (1102), and the like. Since the C-plane allows a nitride thin film to be relatively easily grown thereon and is stable even at high temperatures, sapphire is predominantly utilized as a growth substrate for a nitride. However, the light-transmissive growth substrate 110 may not be limited thereto, and a Si substrate, which is appropriate for obtaining a large diameter and has relatively low manufacturing costs, may be used as the light-transmissive growth substrate 110. Meanwhile, a substrate formed of $MgAl_2O_4$, MgO, $LiAlO_2$, or $LiGaO_2$ may also be used. In addition, an upper surface of the light-transmissive growth substrate 110 may be used as a light exit surface of a light-emitting device, and have a light-transmissive property so as to easily emit light therethrough.

The first conductivity-type semiconductor layer 132, the second conductivity-type semiconductor layer 136, and the active layer 134 interposed between the first conductivity-type semiconductor layer 132 and the second conductivity-type semiconductor layer 136 may constitute a light-emitting structure 130.

According to the exemplary embodiment of the present inventive concept, the first conductivity-type semiconductor layer 132 and the second conductivity-type semiconductor layer 136 may be, although not limited thereto, an n-type semiconductor layer and a p-type semiconductor layer, respectively. More specifically, the first and second conductivity-type semiconductor layers 132 and 136 may be nitride semiconductors. In this case, materials having a formula $Al_xIn_yGa_{(1-x-y)}N$ (here, $0 \le x \le 1$, $0 \le y \le 1$, and $0 \le x+y \le 1$), such as GaN, AlGaN, and InGaN, may correspond to the first and second conductivity-type semiconductor layers 132 and 136.

The active layer 134 may emit light having a predetermined wavelength by recombination of electrons provided by the first or second conductivity-type semiconductor layer 132 or 136 and holes provided by the second or first conductivity-type semiconductor layer 136 or 132. The active layer 134 may have a multiple quantum well (MQW) structure in which quantum well layers and quantum barrier layers are alternately stacked, for example, an InGaN/GaN structure. As necessary, the active layer 134 may have a single quantum well (SQW) structure.

Such first and second conductivity-type semiconductor layers 132 and 136 and the active layer 134 may be formed using a crystal growth process well-known in the art, such as metal-organic chemical vapor deposition (MOCVD), molecular beam epitaxy (MBE), or hydride vapor phase epitaxy (HVPE).

Meanwhile, although not illustrated, a buffer layer may be disposed between the light-transmissive growth substrate 110 and the light-emitting structure 130 to prevent propagation of dislocations due to differences in lattice constant and thermal expansion coefficient between the light-transmissive growth substrate 110 and the light-emitting structure 130.

The reflective layer 120 may be disposed below the light-transmissive growth substrate 110 so that light emitted from the light-emitting structure 130 is reflected upwardly. The reflective layer 120 may be a metal having high reflectivity, for example, Ag or Al. In addition, the reflective layer 120 may be a distributed Bragg reflector.

The transparent electrode layer 140 may be disposed on the light-emitting structure 130. The transparent electrode layer 140 may form ohmic contact with the second conductivity-type semiconductor layer 136, and transmit light emitted from the light-emitting structure 130. The material forming ohmic contact with the second conductivity-type semiconductor layer 136 may include, for example, at least one of Ag, Ni, Al, Rh, Pd, Ir, Ru, Mg, Zn, Pt, and Au, and have a single-layered or multi-layered structure. In addition, the transparent electrode layer 140 may be one of a transparent conductive oxide layer or a nitride layer. For example, the transparent electrode layer 140 may be one selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \le x \le 1$). As necessary, the transparent electrode layer 140 may include graphene.

The selective transmission-reflection layer 150 may be disposed on the transparent electrode layer 140. The selective transmission-reflection layer 150 may be formed by alternately stacking a plurality of dielectric layers having different optical thicknesses at least once.

Figure 2:
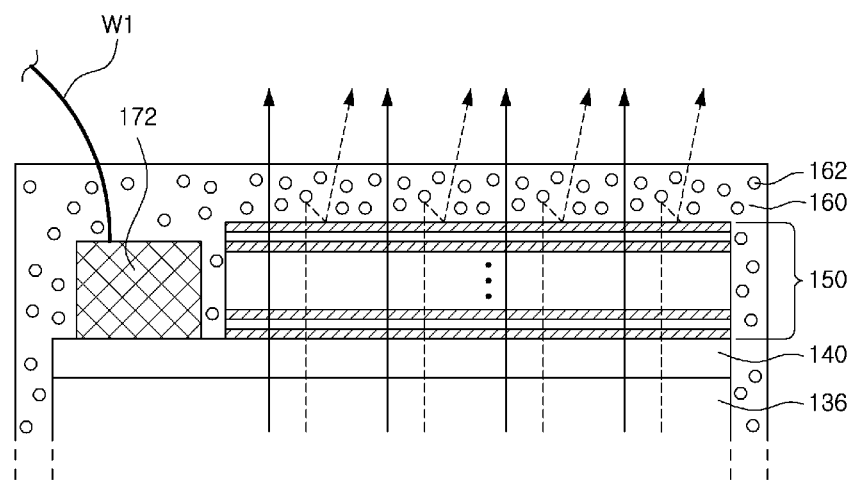
FIG. 2 illustrates a path of light reflected from a light-emitting structure in a semiconductor light-emitting device according to an exemplary embodiment of the present inventive concept.

FIG. 2 illustrates an upper portion of a cross-sectional view in which a phosphor film 160 is disposed on the semiconductor light-emitting device 100 illustrated in FIG. 1. The phosphor film 160 may be a material converting a wavelength of light emitted from the light-emitting structure 130. Light having a variety of colors including a white color may be emitted through the phosphor film 160. The second electrode 172 may be connected to an external electrode pad via a wire W1.

The phosphor film 160 may include phosphor particles 162. The phosphor particles 162 included in the phosphor film 160 may have empirical formulas and colors as follows.

Oxide group: yellow and green $Y_3Al_5O_{12}$:Ce, $Tb_3Al_5O_{12}$: Ce, $Lu_3Al_5O_{12}$: Ce Silicate group: yellow and green $(Ba, Sr)_2SiO_4$:Eu, yellow and orange $(Ba, Sr)_3SiO_5$:Ce Nitride group: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \le x \le 3$, $0 < z < 0.3$, and $0 < y \le 4$) (Here, Ln is at least one element selected from the group consisting of a IIIa group element and a rare earth element, and M is at least one element selected from the group consisting of Ca, Ba, Sr, and Mg.)

Fluoride group: KSF-based red $K_2SiF_6$:$Mn^{4+}$, $K_2TiF_6$: $Mn^{4+}$, $NaYF_4$:$Mn^{4+}$, $NaGdF_4$:$Mn^{4+}$ Referring to FIG. 2, the selective transmission-reflection layer 150 may transmit and output light (solid-line arrows) emitted from the light-emitting structure 130 (please refer to FIG. 1) and, at the same time, reflect light (dashed-line arrows) colliding with the phosphor particles 162 to be re-incident on the light-emitting structure 130 (please refer to FIG. 1). Accordingly, the selective transmission-reflection layer 150 may serve to increase transmittivity of light emitted from the light-emitting structure 130 and reflectivity of light colliding with the phosphor particles 162 and re-incident on the light-emitting structure 130.

In order to increase transmittivity and reflectivity of light, the selective transmission-reflection layer 150 may satisfy a specific condition related to the optical thickness.

The optical thickness may be defined as the following Equation 1.

$$OT = (nd)/\lambda \qquad (1)$$

(Here, OT is an optical thickness, n is a refractive index of a layer, d is a thickness of the layer, and $\lambda$ is a reference wavelength.)

Here, among the plurality of dielectric layers, the sum (hereinafter, S) of an optical thickness of a dielectric layer having a maximum optical thickness and an optical thickness of a dielectric layer having a minimum optical thickness may be in the range of 0.75 to 0.80, by applying a peak wavelength of the light emitted by the light-emitting structure 130 as the reference wavelength into Equation 1. Under the condition, the selective transmission-reflection layer 150 may have a high level of transmittivity with respect to light, more specifically blue-green light, emitted from the light-emitting structure 130, and a high level of reflectivity with respect to light, more specifically red light, wavelength-converted by the phosphor particles 162. The blue-green light may be wavelength-converted by the phosphor particles 162 and emitted as white light.

The plurality of dielectric layers may be selected from the group consisting of, for example, $SiO_2$, $TiO_2$, $Ta_2O_5$, $MgF_2$, $CeO_2$, $Al_2O_3$, $ZrO_2$, MgO, $SnO_2$, ZnO, $B_2O_3$, $Li_2O$, SrO, $HfO_2$, and BaO.

The plurality of dielectric layers may be divided into a first group including a plurality of first dielectric layers having the same optical thickness and a second group including a plurality of second dielectric layers having another same optical thickness, and the first dielectric layers and the second dielectric layers may be alternately stacked. Here, the optical thickness of the first dielectric layer may be greater than the optical thickness of the second dielectric layer. More specifically, the optical thickness of the first dielectric layer may be in the range of 0.5 to 0.65, and the optical thickness of the second dielectric layer may be in the range of 0.1 to 0.35. Here, S of the optical thickness of the first dielectric layer and the optical thickness of the second dielectric layer may be in the range of 0.75 to 0.80.

Referring again to FIG. 1, an enlarged portion of the selective transmission-reflection layer 150 is illustrated in the dashed-line circle of FIG. 1. In the selective transmission-reflection layer 150, first dielectric layers 152 and second dielectric layers 154 having different optical thicknesses from each other are alternately stacked.

Although not illustrated in the drawings, the selective transmission-reflection layer 150 may be divided into a first group including a plurality of first dielectric layers having the same optical thickness, a second group including a plurality of second dielectric layers having another same optical thickness, and a third group including a plurality of third dielectric layers having still another same optical thickness, and may have a repeated structure in which the first dielectric layers, the second dielectric layers, and the third dielectric layers may be sequentially stacked. Here, the first dielectric layer may have a greater optical thickness than the second dielectric layer, and the second dielectric layer may have a greater optical thickness than the third dielectric layer. More specifically, the optical thickness of the first dielectric layer may be in the range of 0.5 to 0.65, and the optical thickness of the third dielectric layer may be in the range of 0.1 to 0.35. Here, the sum of the optical thickness of the first dielectric layers and the optical thickness of the third dielectric layer may be in the range of 0.75 to 0.80. In the selective transmission-reflection layer 150, the first and third dielectric layers may not directly contact each other.

Figure 3A:
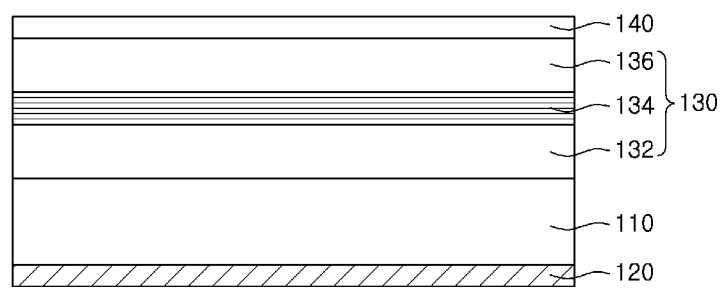
FIGS. 3A to 3C are a process diagram illustrating a method of fabricating a semiconductor light-emitting device according to an exemplary embodiment of the present inventive concept.
Figure 3B:
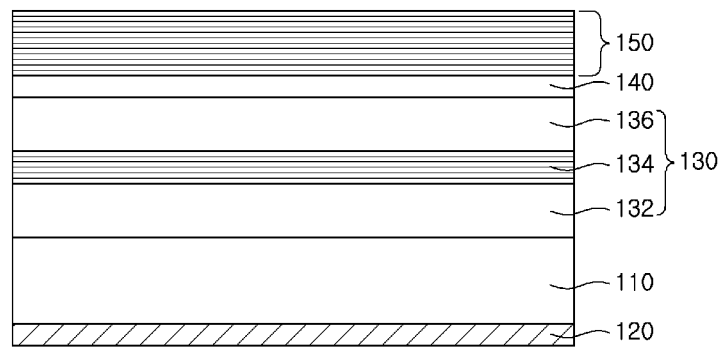
Figure 3C:
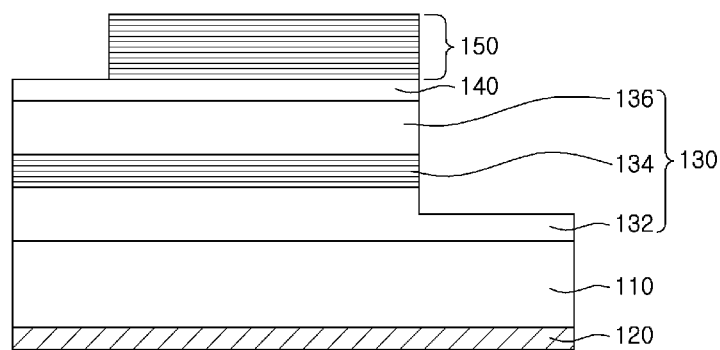

FIGS. 3A to 3C are a process diagram illustrating a method of fabricating the semiconductor light-emitting device 100 illustrated in FIG. 1.

Referring to FIG. 3A, a reflective layer 120, a light-transmissive growth substrate 110 disposed on the reflective layer 120, a light-emitting structure 130 disposed on the light-transmissive growth substrate 110 (wherein the light-emitting structure 130 may constitute a first conductivity-type semiconductor layer 132, an active layer 134 disposed on the first conductivity-type semiconductor layer 132, and a second conductivity-type semiconductor layer 136 disposed on the active layer 134), and a transparent electrode layer 140 disposed on the second conductivity-type semiconductor layer 136 may be formed. A process of growing each of the layers may be a crystal growth process well-known in the art, such as MOCVD, MBE, and HVPE.

Next, referring to FIG. 3B, a selective transmission-reflection layer 150 may be grown on the transparent electrode layer 140. The process of growing the selective transmission-reflection layer 150 may be a crystal growth process well-known in the art, such as MOCVD, MBE, and HVPE.

Next, referring to FIG. 3C, in order to form the second electrode 172 (please refer to FIG. 1), a portion of the selective transmission-reflection layer 150 may be removed to expose a portion of the transparent electrode layer 140. In addition, in order to form the first electrode 170 (please refer to FIG. 1), another portion of the selective transmission-reflection layer 150 may be removed to expose a portion of the first conductivity-type semiconductor layer 132. The removal process may use, for example, a dry etching process. More specifically, the first conductivity-type semiconductor layer 132 may be plasma-etched using a combination of $CF_4$, $C_2F_6$, $C_3F_8$, $C_4F_8$, or $CHF_3$ with at least one of $O_2$ and Ar.

Figure 4:
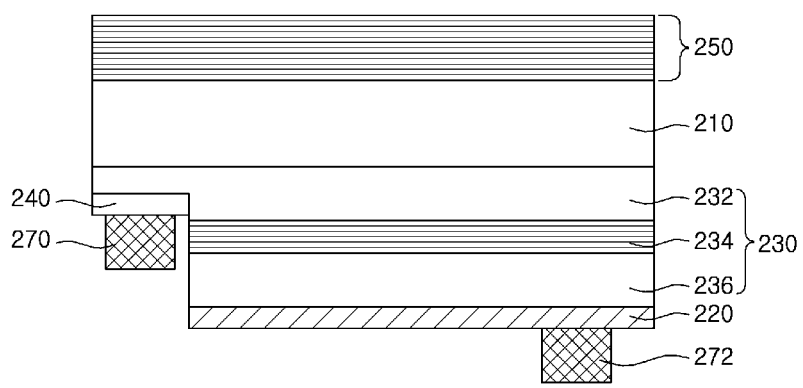
FIG. 4 is a cross-sectional view illustrating a semiconductor light-emitting device according to an exemplary embodiment of the present inventive concept.

FIG. 4 is a cross-sectional view illustrating a flip-chip semiconductor light-emitting device according to an exemplary embodiment of the present inventive concept.

Referring to FIG. 4, a semiconductor light-emitting device 200 may include a reflective layer 220, a second conductivity-type semiconductor layer 236 disposed on the reflective layer 220, an active layer 234 disposed on the second conductivity-type semiconductor layer 236, a first conductivity-type semiconductor layer 232 disposed on the active layer 234, a light-transmissive growth substrate 210 disposed on the first conductivity-type semiconductor layer 232, a selective transmission-reflection layer 250 disposed on the light-transmissive growth substrate 210, a transparent electrode layer 240 disposed on a partially exposed lower surface of the first conductivity-type semiconductor layer 232, a first electrode 270 disposed below the transparent electrode layer 240, and a second electrode 272 disposed below the reflective layer 220. The first conductivity-type semiconductor layer 232, the active layer 234, and the second conductivity-type semiconductor layer 236 may constitute a light-emitting structure 230.

In the semiconductor light-emitting device 200, light emitted downwardly from the light-emitting structure 230 is reflected from the reflective layer 220 and then emitted upwardly from the light-emitting device 200. Since the electrodes are formed below the light-emitting structure 230 of the flip-chip semiconductor light-emitting device 200, a light-emitting surface thereof is greater than that of a vertical or horizontal semiconductor light-emitting device.

Figure 5:
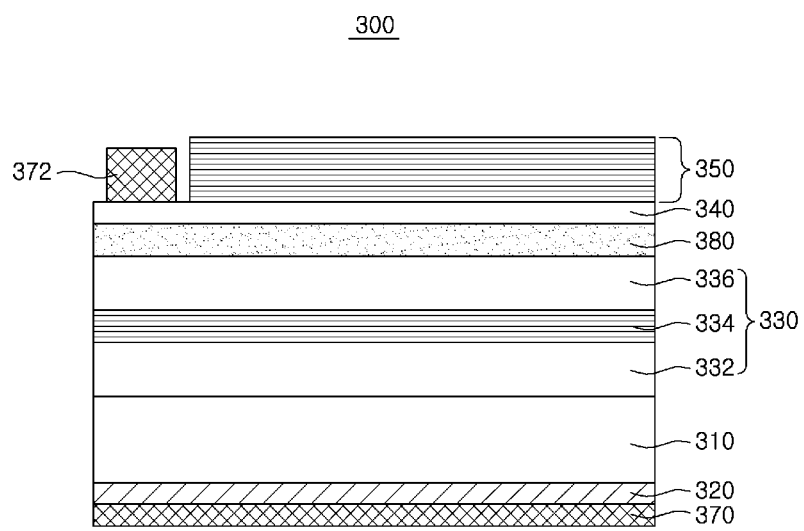
FIG. 5 is a cross-sectional view illustrating a semiconductor light-emitting device according to an exemplary embodiment of the present inventive concept.

FIG. 5 is a cross-sectional view illustrating a vertical semiconductor light-emitting device according to an exemplary embodiment of the present inventive concept.

Referring to FIG. 5, the semiconductor light-emitting device 300 may include a first electrode 370, a reflective layer 320 disposed on the first electrode 370, a conductive growth substrate 310 disposed on the reflective layer 320, a first conductivity-type semiconductor layer 332 disposed on the conductive growth substrate 310, an active layer 334 disposed on the first conductivity-type semiconductor layer 332, a second conductivity-type semiconductor layer 336 disposed on the active layer 334, a current-spreading layer 380 disposed on the second conductivity-type semiconductor layer 336, a transparent electrode layer 340 disposed on the current-spreading layer 380, a selective transmission-reflection layer 350 disposed on the transparent electrode layer 340, and a second electrode 372 disposed on an exposed portion of the transparent electrode layer 340. The first conductivity-type semiconductor layer 332, the active layer 334, and the second conductivity-type semiconductor layer 336 may constitute a light-emitting structure 330.

Figure 6:
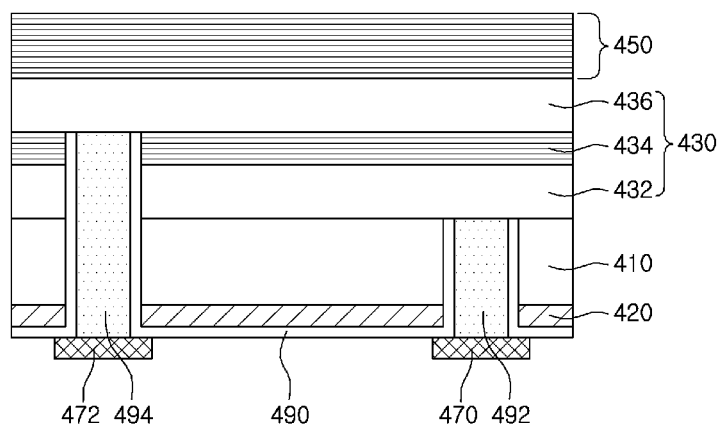
FIG. 6 is a cross-sectional view illustrating a semiconductor light-emitting device according to an exemplary embodiment of the present inventive concept.

FIG. 6 is a cross-sectional view illustrating a semiconductor light-emitting device according to an exemplary embodiment of the present inventive concept.

Referring to FIG. 6, the semiconductor light-emitting device 400 may include a reflective layer 420, a light-transmissive growth substrate 410 disposed on the reflective layer 420, a first conductivity-type semiconductor layer 432 disposed on the light-transmissive growth substrate 410, an active layer 434 disposed on the first conductivity-type semiconductor layer 432, a second conductivity-type semiconductor layer 436 disposed on the active layer 434, a selective transmission-reflection layer 450 disposed on the second conductivity-type semiconductor layer 436, a first electrode 470 electrically connected to the first conductivity-type semiconductor layer 432 through a first conductive via 492, and a second electrode 472 electrically connected to the second conductivity-type semiconductor layer 436 through a second conductive via 494. The insulating layer 490 may be disposed on the lateral surfaces of the first and second conductive vias 492 and 494, and below the reflective layer 420, so that the first electrode 470 is not in contact with the second conductivity-type semiconductor layer 436, and the second electrode 472 is not in contact with the first conductivity-type semiconductor layer 432. The first conductivity-type semiconductor layer 432, the active layer 434, and the second conductivity-type semiconductor layer 436 may constitute a light-emitting structure 430.

Figure 7:
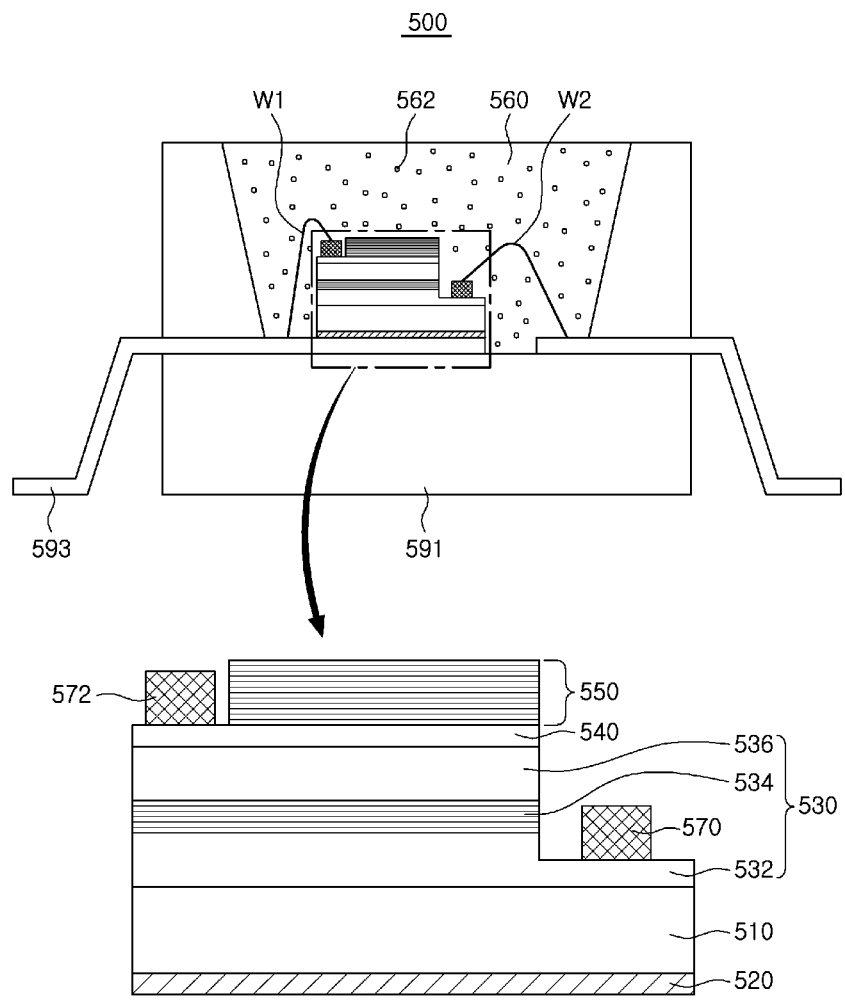
FIGS. 7 and 8 are cross-sectional views illustrating semiconductor light-emitting device packages including a semiconductor light-emitting device according to an exemplary embodiment of the present inventive concept.

FIG. 7 is a cross-sectional view illustrating a semiconductor light-emitting device package including a horizontal semiconductor light-emitting device according to an exemplary embodiment of the present inventive concept.

Referring to FIG. 7, a semiconductor light-emitting device 500 may include a reflective layer 520, a light-transmissive growth substrate 510 disposed on the reflective layer 520, a first conductivity-type semiconductor layer 532 disposed on the light-transmissive growth substrate 510, an active layer 534 disposed on the first conductivity-type semiconductor layer 532, a second conductivity-type semiconductor layer 536 disposed on the active layer 534, a transparent electrode layer 540 disposed on the second conductivity-type semiconductor layer 536, a selective transmitting-reflecting layer 550 disposed on the transparent electrode layer 540, a second electrode 572 disposed on a partially exposed upper surface of the transparent electrode layer 540, and a first electrode 570 disposed on a partially exposed upper surface of the first conductivity-type semiconductor layer 532. The first conductivity-type semiconductor layer 532, the active layer 534, and the second conductivity-type semiconductor layer 536 may constitute a light-emitting structure 530. The semiconductor light-emitting device 500 may be mounted on a lead frame 593, and electrodes thereof may be electrically connected to the lead frame 593 by wires W1 and W2, respectively. As necessary, the semiconductor light-emitting device 500 may be mounted on an area other than the lead frame 593, for example, on a package body 591. In addition, the package body 591 may have a cup (U) shape in order to improve a reflective efficiency of light, and the U-shaped package body 591 filled with a phosphor layer 560 including a light-transmissive material and phosphor particles 562 dispersed therein may be formed in order to encapsulate the semiconductor light-emitting device 500. The selective transmission-reflection layer 550 may increase transmittivity of light emitted from the light-emitting structure 530 and reflectivity of light colliding with the phosphor particles 562 and re-incident on the light-emitting structure 530.

Figure 8:
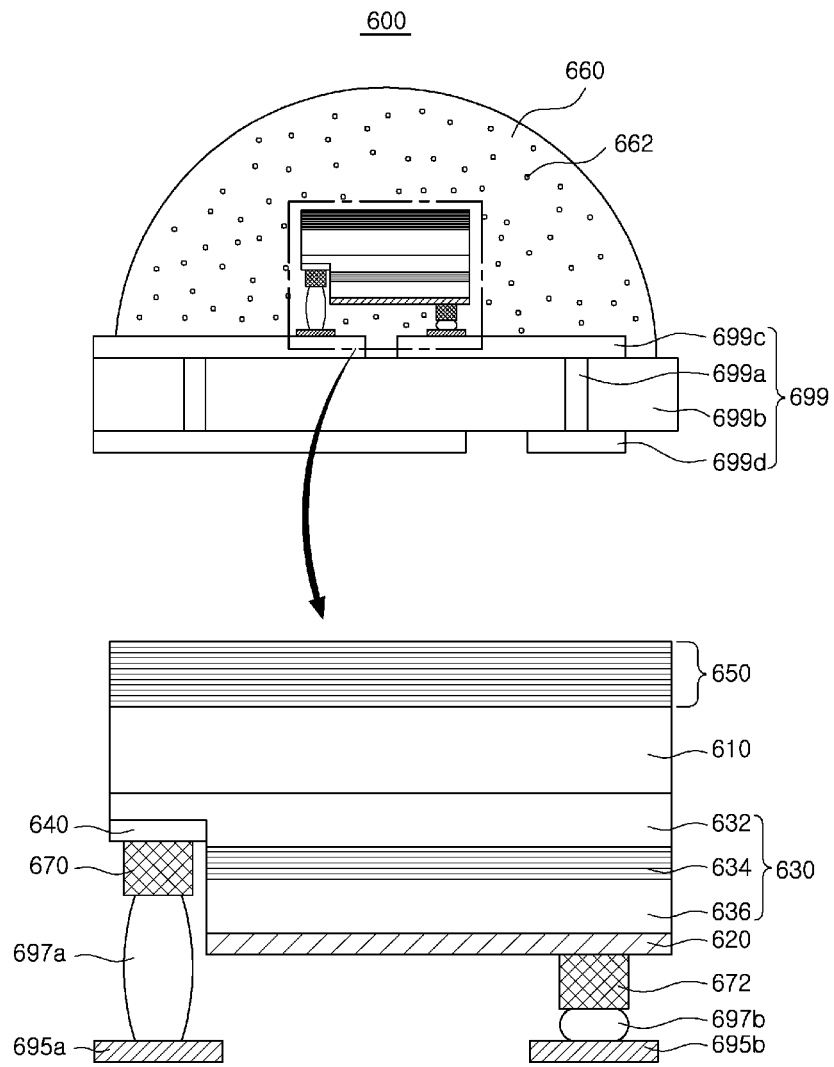

FIG. 8 is a cross-sectional view illustrating a semiconductor light-emitting device package including a flip-chip semiconductor light-emitting device according to an exemplary embodiment of the present inventive concept.

Referring to FIG. 8, a semiconductor light-emitting device 600 may include a reflective layer 620, a second conductivity-type semiconductor layer 636 disposed on the reflective layer 620, an active layer 634 disposed on the second conductivity-type semiconductor layer 636, a first conductivity-type semiconductor layer 632 disposed on the active layer 634, a light-transmissive growth substrate 610 disposed on the first conductivity-type semiconductor layer 632, a selective transmission-reflection layer 650 disposed on the light-transmissive growth substrate 610, a transparent electrode layer 640 disposed below a partially exposed lower surface of the first conductivity-type semiconductor layer 632, a first electrode 670 disposed below the transparent electrode layer 640, and a second electrode 672 disposed below the reflective layer 620. The first conductivity-type semiconductor layer 632, the active layer 634, and the second conductivity-type semiconductor layer 636 may constitute a light-emitting structure 630. The first electrode 670 may be connected to a first electrode pad 695a through a first conductive bump 697a, and the second electrode 672 may be connected to a second electrode pad 695b through a second conductive bump 697b. The semiconductor light-emitting device 600 may be mounted on a mounting substrate 699 and electrically connected to the mounting substrate 699. The mounting substrate 699 may include a substrate body 699b, an upper electrode 699c, a lower electrode 699d, and a through electrode 699a connecting the upper electrode 699c and the lower electrode 699d. The mounting substrate 699 may be a PCB, an MCPCB, an MPCB, or a FPCB, and a structure of the mounting substrate 699 may be applied in various forms. A phosphor layer 660 may have a dome-shaped lens structure having a convex upper surface. In some embodiments, the phosphor layer 660 may have a convex or concave lens structure to adjust an orientation angle of light emitted through the upper surface of the phosphor layer 660. The phosphor layer 660 may include phosphor particles 662 converting a wavelength of light emitted from the semiconductor light-emitting device 600. The selective transmission-reflection layer 650 may increase transmittivity of light emitted from the light-emitting structure 630 and reflectivity of light colliding with the phosphor particles 662 and re-incident on the light-emitting structure 630.

Figure 9:
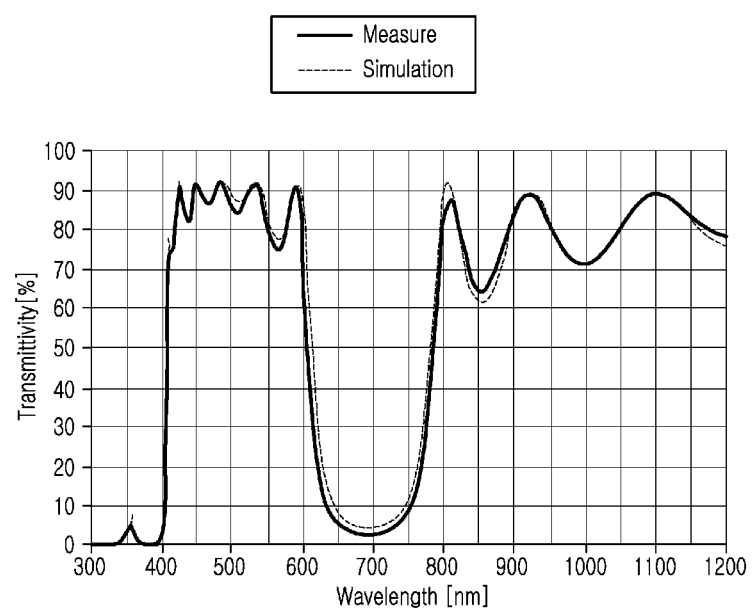
FIG. 9 is a graph illustrating transmittivity according to the wavelength of light emitted from a semiconductor light-emitting device according to an exemplary embodiment of the present inventive concept.

FIG. 9 is a graph illustrating transmittivity according to the wavelength of light emitted from the semiconductor light-emitting device 100 illustrated in FIG. 1. The solid line represents an experimentally measured result and the dotted line represents a simulated result.

Referring to FIG. 9, a transmittivity of light belonging to a wavelength band of blue-green light (400 to 600 nm) among wavelengths of visible light (380 to 750 nm) is significantly high.

Figure 10:
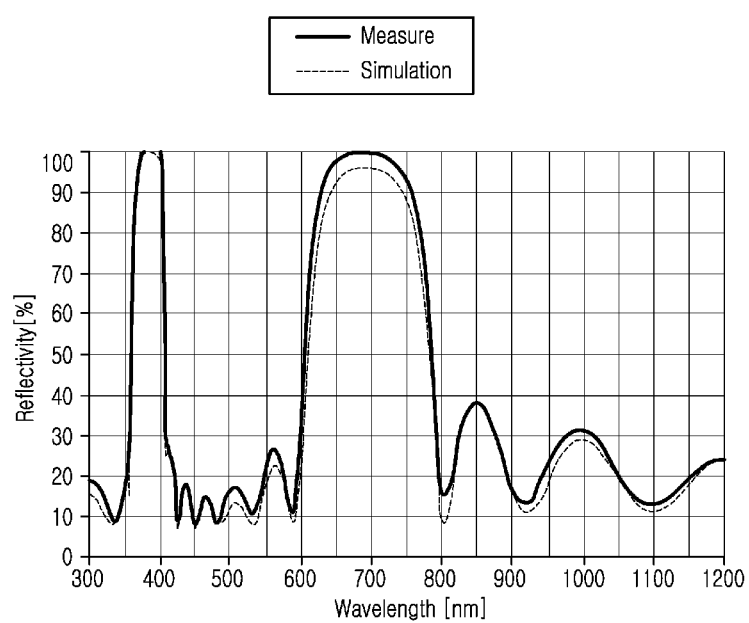
FIG. 10 is a graph illustrating a reflectivity according to the wavelength of light emitted from a semiconductor light-emitting device according to an exemplary embodiment of the present inventive concept.

FIG. 10 is a graph illustrating the reflectivity according to the wavelength of light emitted from the semiconductor light-emitting device 200 illustrated in FIG. 4. The solid line represents an experimentally measured result and the dotted line represents a simulated result.

Referring to FIG. 10, a reflectivity of light belonging to a wavelength band of red light (600 to 750 nm) among the wavelengths of visible light (380 to 750 nm) is significantly high.

Referring to FIGS. 9 and 10, a semiconductor light-emitting device including a selective transmission-reflection layer according to the exemplary embodiments of the present inventive concept may have a high transmittivity when the light-emitting structure emitting blue-red light is adopted. In addition, even when the wavelength of the transmitted light is converted to that of red light by the phosphor particles, the semiconductor light-emitting device including the selective transmission-reflection layer according to the exemplary embodiments of the present inventive concept may have a high reflectivity of light re-incident on the light-emitting structure. More specifically, when the semiconductor light-emitting device adopts a light-emitting structure emitting blue-green light, a more luminous flux may be obtained.

Figure 11:
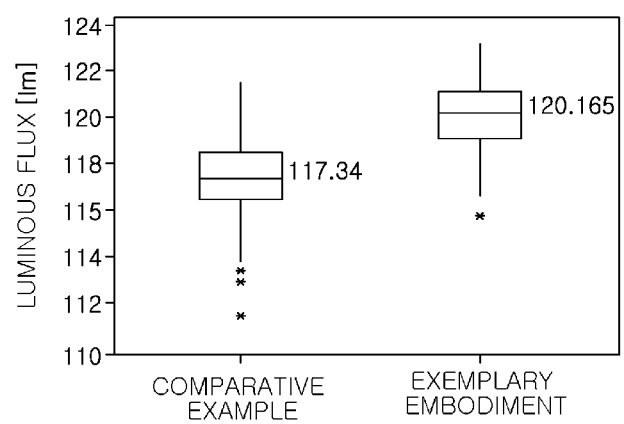
FIG. 11 is a graph illustrating luminous fluxes of an exemplary embodiment of the present inventive concept and a comparative example.

FIG. 11 is a graph illustrating luminous fluxes of an exemplary embodiment of the present inventive concept and a comparative example. The exemplary embodiment is a semiconductor light-emitting device package including the plurality of semiconductor light-emitting devices 200 illustrated in FIG. 4, and the comparative example is a semiconductor light-emitting device package including a plurality of semiconductor light-emitting devices having the same structure as the semiconductor light-emitting devices 200 except that the selective transmission-reflection layer 250 (please refer to FIG. 4) is removed therefrom.

Referring to FIG. 11, an average luminous flux of the exemplary embodiment was 120.1 lm, and an average luminous flux of the comparative example was 117.3 lm. That is, the luminous flux of the exemplary embodiment was increased by 2.3% compared to that of the comparative example. In addition, a color rendering index (CRI) of the exemplary embodiment was 86.2, and a CRI of the comparative example was 86.1. That is, when a selective transmission-reflection layer according to the embodiment of the present inventive concept is adopted, a luminous flux may be increased while the same level of CRI is maintained.

Figure 12:
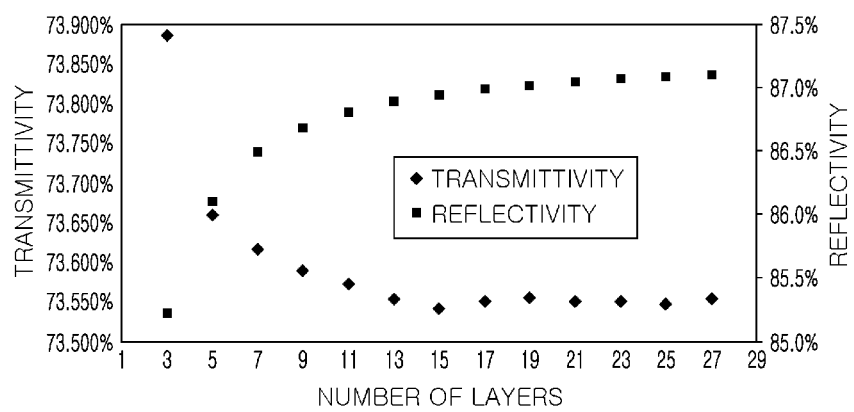
FIG. 12 is a graph illustrating variations in transmittivity and reflectivity according to the number of stacks of dielectric layers.

FIG. 12 is a graph illustrating variations in transmittivity and reflectivity according to the number of stacks of dielectric layers constituting a selective transmission-reflection layer.

Referring to FIG. 12, when the number of stacks of the dielectric layers is 15 or more, a transmittivity value and a reflectivity value may reach their threshold values. That is, the selective transmission-reflection layer may have constant values of transmittivity and reflectivity even when 15 or more dielectric layers are stacked.

Figure 13:
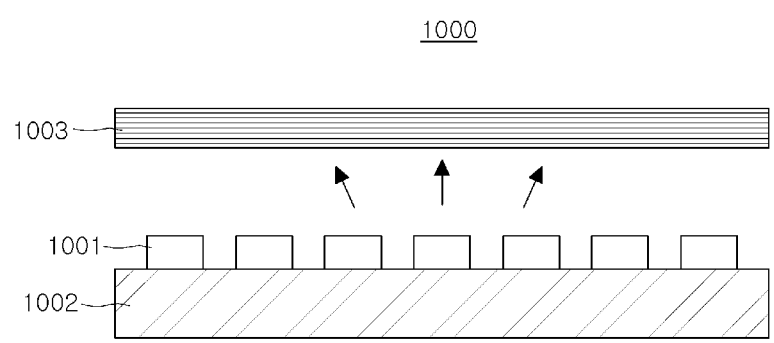
FIGS. 13 and 14 illustrate examples of a backlight unit including a semiconductor light-emitting device according to an exemplary embodiment of the present inventive concept.
Figure 14:
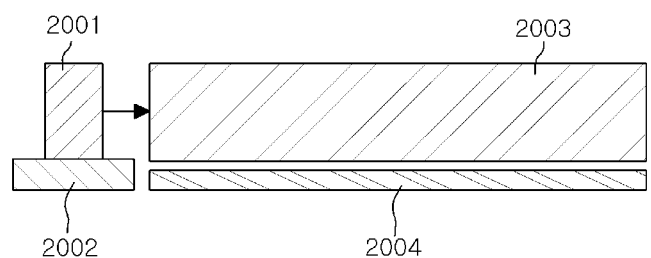

FIGS. 13 and 14 illustrate examples of a backlight unit including a semiconductor light-emitting device according to an exemplary embodiment of the present inventive concept.

Referring to FIG. 13, a backlight unit 1000 may include a light source 1001 mounted on a substrate 1002, and one or more optical sheets 1003 disposed on the light source 1001. The light source 1001 may include the above-described semiconductor light-emitting device or a package including the semiconductor light-emitting device.

The light source 1001 in the backlight unit 1000 illustrated in FIG. 13 emits light toward a top surface where a liquid crystal display (LCD) is disposed. On the contrary, in another backlight unit 2000 illustrated in FIG. 14, a light source 2001 mounted on a substrate 2002 emits light in a lateral direction, and the emitted light may be incident to a light guide plate 2003 and converted to the form of surface light. Light passing through the light guide plate 2003 is emitted upwardly, and a reflective layer 2004 may be disposed on a bottom surface of the light guide plate 2003 to improve light extraction efficiency.

Figure 15:
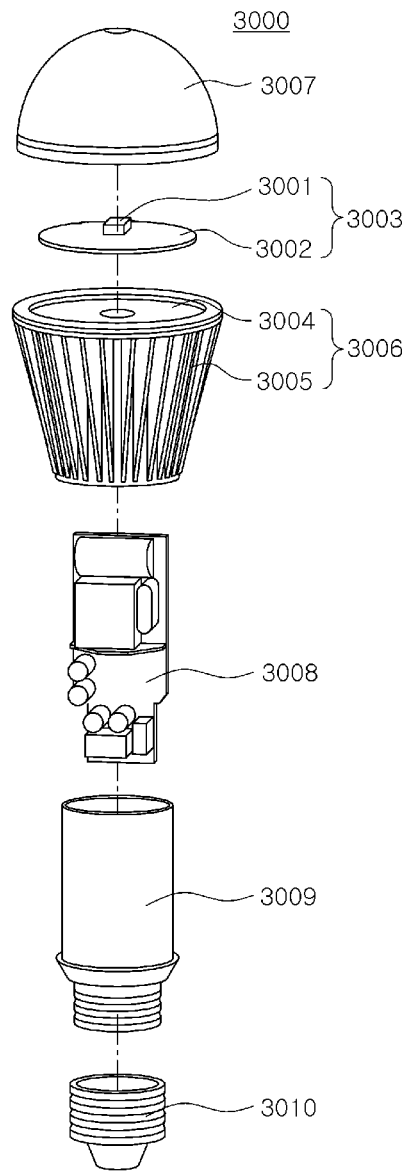
FIG. 15 illustrates an example of an illumination apparatus including a semiconductor light-emitting device according to an exemplary embodiment of the present inventive concept.

FIG. 15 is an exploded perspective view illustrating an illumination apparatus including a semiconductor light-emitting device according to an exemplary embodiment of the present inventive concept.

The illumination apparatus 3000 of FIG. 15 is illustrated as a bulb-type lamp as an example, and includes a light-emitting module 3003, a driving unit 3008, and an external connection portion 3010.

In addition, external structures, such as external and internal housings 3006 and 3009 and a cover 3007, may be further included. The light-emitting module 3003 may include a light source 3001, that is, the above-described semiconductor light-emitting device or a package including the nanostructure semiconductor light-emitting device, and a circuit board 3002 with the light source 3001 mounted thereon. For example, first and second electrodes of the semiconductor light-emitting device may be electrically connected to an electrode pattern of the circuit board 3002. In this exemplary embodiment, a single light source 3001 is mounted on the circuit board 3002, but a plurality of light sources 3001 may be mounted as needed.

The external housing 3006 may function as a heat dissipation unit, and include a heat dissipation plate 3004 in direct contact with the light-emitting module 3003 to enhance a heat dissipation effect, and a heat radiation fin 3005 surrounding side surfaces of the illumination apparatus 3000. The cover 3007 may be installed on the light-emitting module 3003, and have a convex lens shape. The driving unit 3008 may be installed in the internal housing 3009 and connected to the external connection portion 3010, such as a socket structure, to receive power from an external power source.

In addition, the driving unit 3008 may convert the power to an appropriate current source capable of driving the light source 3001 of the light-emitting module 3003. For example, the driving unit 3008 may be configured as an AC-DC converter, a rectifying circuit component, or the like.

Figure 16:
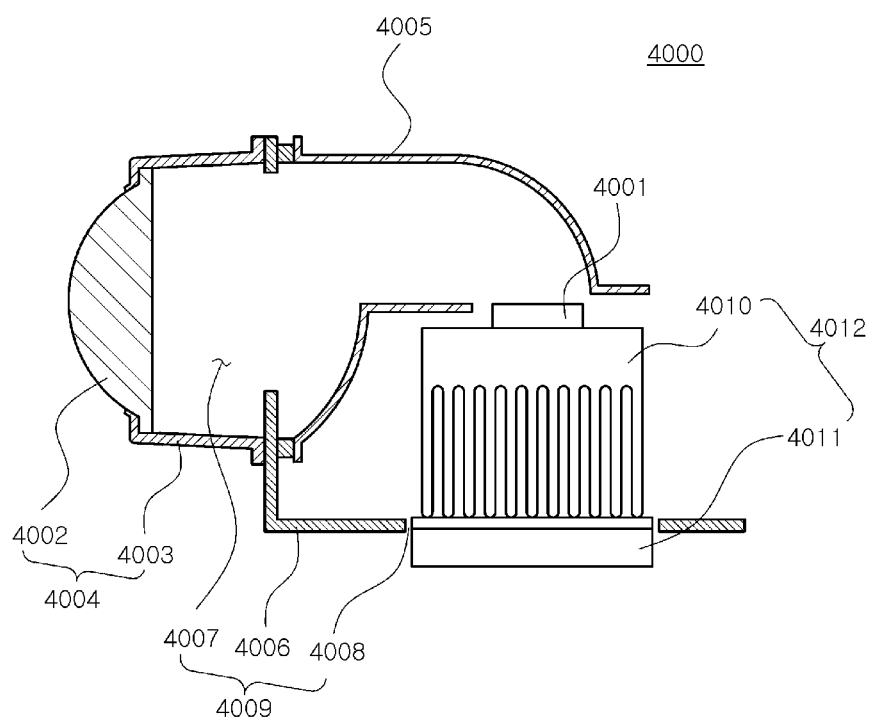
FIG. 16 illustrates an example of a headlamp including a semiconductor light-emitting device according to an exemplary embodiment of the present inventive concept.

FIG. 16 illustrates an example in which a semiconductor light-emitting device according to an exemplary embodiment of the present inventive concept is applied to a headlamp.

Referring to FIG. 16, a headlamp 4000 used as a vehicle lamp, or the like, may include a light source 4001, a reflective unit 4005, and a lens cover unit 4004. The lens cover unit 4004 may include a hollow-type guide 4003 and a lens 4002. The light source 4001 may include the above-described semiconductor light-emitting device or a package including the semiconductor light-emitting device.

The headlamp 4000 may further include a heat dissipation unit 4012 dissipating heat generated by the light source 4001 outwardly. In order to effectively dissipate heat, the heat dissipation unit 4012 may include a heat sink 4010 and a cooling fan 4011. In addition, the headlamp 4000 may further include a housing 4009 fixedly supporting the heat dissipation unit 4012 and the reflective unit 4005. The housing 4009 may have a central hole 4008 formed in one surface thereof, in which the heat dissipation unit 4012 is coupledly installed.

The housing 4009 may include a front hole 4007 formed on the other surface integrally connected to the one surface and bent in a right angle direction. The front hole 4007 may fix the reflective unit 4005 to be disposed above the light source 4001. Accordingly, a front side of the housing 4009 may be open by the reflective unit 4005. The reflective unit 4005 is fixed to the housing 4009 such that the opened front side corresponds to the front hole 4007, and thereby light reflected by the reflective unit 4005 may pass through the front hole 4007 to be emitted outwardly.

While exemplary embodiments have been shown and described above, it will be apparent to those skilled in the art that modifications and variations could be made without departing from the scope of the present invention as defined by the appended claims.

What is claimed is:

1. A semiconductor light-emitting device, comprising:
    a light-emitting structure including a first conductivity-type semiconductor layer, an active layer, and a second conductivity-type semiconductor layer; and
    a selective transmission-reflection layer including a plurality of dielectric layers having different optical thicknesses alternately stacked at least once on the light-emitting structure,
    wherein a sum of an optical thickness of a dielectric layer having a maximum optical thickness and an optical thickness of a dielectric layer having a minimum optical thickness is in the range of 0.75 to 0.80, in which the optical thickness is defined by a formula, $(nd)/\lambda$, where n is a refractive index of a respective dielectric layer, d is a thickness of the respective dielectric layer, and $\lambda$ is a peak wavelength of light emitted by the light-emitting structure, and
    wherein the selective transmission-reflection layer includes a first dielectric layer, a second dielectric layer, and a third dielectric layer, and an optical thickness of the first dielectric layer is greater than an optical thickness of the second dielectric layer, and the optical thickness of the second dielectric layer is greater than an optical thickness of the third dielectric layer.

2. The semiconductor light-emitting device of claim 1, wherein the optical thickness of the first optical thickness is in the range of 0.5 to 0.65, and the optical thickness of the third dielectric layer is in the range of 0.1 to 0.35.

3. The semiconductor light-emitting device of claim 1, wherein the first and third dielectric layers do not directly contact each other.

4. The semiconductor light-emitting device claim 1, further comprising a first electrode and a second electrode disposed below the light-emitting structure.

5. The semiconductor light-emitting device of claim 1, further comprising a first electrode and a second electrode disposed on the light-emitting structure.

6. The semiconductor light-emitting device of claim 1, further comprising a first electrode disposed below the light-emitting structure, and a second electrode disposed on the light-emitting structure.

7. The semiconductor light-emitting device of claim 1, further comprising a reflective layer,
    wherein the light-emitting structure is interposed between the reflective layer and the selective transmission-reflection layer.

8. The semiconductor light-emitting device of claim 1, further comprising a transparent electrode layer disposed on the second conductivity-type semiconductor layer.

9. The semiconductor light-emitting device of claim 1, wherein the selective transmission-reflection layer transmits blue-green light and reflects red light.

10. The semiconductor light-emitting device of claim 1, wherein the number of the plurality of dielectric layers is 15 or more.

11. The semiconductor light-emitting device of claim 1, wherein the plurality of dielectric layers are selected from the group consisting of $SiO_2$, $TiO_2$, $Ta_2O_5$, $MgF_2$, $CeO_2$, $Al_2O_3$, $ZrO_2$, MgO, $SnO_2$, ZnO, $B_2O_3$, $Li_2O$, SrO, $HfO_2$, and BaO.

12. The semiconductor light-emitting device of claim 1, further comprising a phosphor layer disposed on the selective transmission-reflection layer.

13. A semiconductor light-emitting device, comprising:
    a light-emitting structure including an n-type semiconductor layer, an active layer, and a p-type semiconductor layer;
    a selective transmission-reflection layer disposed on the light-emitting structure and including a first dielectric layer having an optical thickness in the range of 0.5 to 0.65 a second dielectric layer having an optical thickness in the range of 0.1 to 0.35 alternately stacked at least once, and an additional dielectric layer having an optical thickness less than the first optical thickness and greater than the second optical thickness disposed between the first dielectric layer and the second dielectric layer, in which the optical thickness is defined by a formula, $(nd)/\lambda$, where n is a refractive index of a respective dielectric layer, d is a thickness of the respective dielectric layer, and $\lambda$ is a peak wavelength of light emitted by the light-emitting structure; and
    a phosphor layer disposed on the selective transmission-reflection layer.

14. A semiconductor light-emitting device, comprising:
    a light-emitting structure including a first conductivity-type semiconductor layer, an active layer, and a second conductivity-type semiconductor layer; and
    a selective transmission-reflection layer formed on the light-emitting structure, and including a first group including a plurality of first dielectric layers each having a first optical thickness, a second group including a plurality of second dielectric layers each having a second optical thickness, and a third group including a plurality of third dielectric layers each having a third optical thickness, wherein the first dielectric layers, the second dielectric layers, and the third dielectric layers are sequentially stacked,
    wherein the first optical thickness is in the range of 0.5 to 0.65, the third optical thickness is in the range of 0.1 to 0.35, and the second optical thickness is less than the first optical thickness and greater than the third optical thickness, and
    wherein the optical thicknesses is defined by a formula, $(nd)/\lambda$, where n is a refractive index of a respective dielectric layer, d is a thickness of the respective dielectric layer, and λ is a peak wavelength of light emitted by the light-emitting structure.

15. The semiconductor light-emitting device of claim 14, further comprising a phosphor layer,
   wherein the selective transmission-reflection layer is interposed between the phosphor layer and the light-emitting structure.

16. The semiconductor light-emitting device of claim 14, wherein the selective transmission-reflection layer transmits blue-green light and reflects red light.

17. The semiconductor light-emitting device of claim 14, where a sum of the first optical thickness and the third optical thickness is in the range of 0.75 to 0.8.

* * * * *